United States Patent
Izumi et al.

(10) Patent No.: US 6,340,812 B1
(45) Date of Patent: Jan. 22, 2002

(54) TWO-DIMENSIONAL IMAGE DETECTOR WITH ELECTRODES ON COUNTER SUBSTRATE

(75) Inventors: Yoshihiro Izumi, Kashihara; Osamu Teranuma, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/397,147

(22) Filed: Sep. 16, 1999

(30) Foreign Application Priority Data

Sep. 29, 1998 (JP) .......................................... 10-274867
Jun. 7, 1999 (JP) .......................................... 11-158881

(51) Int. Cl.$^7$ ............................................... H01J 27/00
(52) U.S. Cl. ................................ 250/208.1; 250/370.09
(58) Field of Search ............ 250/208.1, 370.01–370.13; 349/150, 153; 438/6, 59, 67; 257/290, 443, 452

(56) References Cited

U.S. PATENT DOCUMENTS 5,990,619 A  * 11/1999 Ilcisin et al. ................. 313/584

OTHER PUBLICATIONS

Japanese Publication for Laid–Open Patent Application No. 342098/1994 (Tokukaihei 6–342098) (Published Dec. 13, 1994.
Lee et al, "A New Digital Detector for Projection Radiography", *SPIE*, vol. 2432, pp. 237–249, 1995.
Jeromin et al, "Application of a–Si Active–Matrix Technology in a X–Ray Detector Panel", SID International Symposium, Digest of Technical Papers, pp. 91–94, 1997.
U.S. application No. 09/229,269, filed Jan. 13, 1999.
U.S. application No. 09/239,855, filed Jan. 29, 1999.

* cited by examiner

*Primary Examiner*—Que T. Le
*Assistant Examiner*—Thanh X. Luu
(74) *Attorney, Agent, or Firm*—Nixon & Vanderhye, P.C.

(57) ABSTRACT

A method for manufacturing a two-dimensional image detector in which electrically connected via a conductive material such as an anisotropic conductive adhesive are (i) an active matrix substrate having a pixel-arrayed layer including pixel electrodes and switching elements arranged in a lattice form and (ii) a counter substrate having a semiconductor layer with photoconductivity and an electrode section composed of connecting electrodes, a carrier blocking layer, etc., formed so as to face substantially an entirety of a surface of the pixel-arrayed layer, includes the step of (a) forming a plurality of protuberance electrodes on a connection surface of the counter substrate by blasting. By the foregoing method, a plurality of protuberance electrodes with a uniform height can be easily formed on one and same substrate. By connecting such a counter substrate having a plurality of protuberance electrodes with a uniform height with the active matrix substrate by means of an anisotropic conductive adhesive, a two-dimensional image detector hardly prone to connection defects can be provided even in the case where electric connection has to be obtained densely in a large surface area.

26 Claims, 10 Drawing Sheets

PROTUBERANCE GROOVE(DEPTH 20μm)

TWO-DIMENSIONAL IMAGE DETECTOR WITH ELECTRODES ON COUNTER SUBSTRATE

FIELD OF THE INVENTION

The present invention relates to a two-dimensional image detector capable of detecting images in radioactive rays (such as X-rays), visible light, infrared light, etc.

BACKGROUND OF THE INVENTION

Conventionally, a known type of two-dimensional image detector for radioactive rays is a device comprising a two-dimensional arrangement of semiconductor sensors which detect X-rays and produce charge (electron-hole) pairs, each sensor being provided with an electrical switch, in which the electrical switches are sequentially turned ON by row, and the charge of each sensor in that row is read out.

The principle of such a two-dimensional image detector and specific structures therefor are discussed in, for example, D. L. Lee, et al, "A New Digital Detector for Projection Radiography" (*Physics of Medical Imaging*, Proc. SPIE 2432, pp.237–249, 1995); L. S. Jeromin, et al, "Application of a-Si Active-Matrix Technology in a X-Ray Detector Panel" (SID (*Society for Information Display*) *International Symposium, Digest of Technical Papers*, pp.91–94, 1997); and Japanese Unexamined Patent Publication No. 6-342098/1994 (*Tokukaihei* 6-342098, published on Dec. 13, 1994).

The following will explain the principle and structure of the foregoing conventional two-dimensional image detector for radioactive rays. FIG. 10 is a perspective view schematically showing the structure of the foregoing conventional two-dimensional image detector for radioactive rays. Further, FIG. 11 is a cross-sectional view schematically showing the structure of one pixel thereof.

As shown in FIGS. 10 and 11, the foregoing conventional two-dimensional image detector for radioactive rays includes an active matrix substrate made up of electrode lines (gate electrodes 52 and source electrodes 53) arranged in an XY matrix, TFTs (thin-film transistors) 54, charge storage capacitors (Cs) 55, etc., provided on a glass substrate 51. Further, over substantially the entire surface of the active matrix substrate 51 are provided a photoconductive film 56, a dielectric layer 57, and an upper electrode 58.

Each charge storage capacitor 55 is made up of a Cs electrode 59 and a pixel electrode 60 (which is connected to the drain electrode of the TFT 54), provided opposite each other but separated by an insulating layer 61.

The photoconductive film 56 is made of a semiconductor material which produces a charge (electron-hole) when radioactive rays such as X-rays are projected thereon; the examples discussed in the foregoing documents use amorphous selenium (a-Se), which has high dark resistance and good photoconductive characteristics for X-rays. The photoconductive film 56 is formed by vacuum vapor deposition with a thickness of 300 μm to 600 μm.

For the foregoing active matrix substrate, it is possible to use active matrix substrates formed in the process of manufacturing liquid crystal display devices. For example, an active matrix substrate used in an active matrix liquid crystal display device (AMLCD) has a structure which includes TFTs made of amorphous silicon (a-Si) or polycrystalline silicon (p-Si), electrodes arranged in an XY matrix, and charge storage capacitors (Cs). Accordingly, it is easy to use such an AMLCD as an active matrix substrate for a two-dimensional image detector for radioactive rays, necessitating only minor design changes.

The following will explain the operating principle of the foregoing conventional two-dimensional image detector for radioactive rays.

When radioactive rays are projected onto the photoconductive film 56, charge (electron-hole) pairs are produced therein. As shown in FIGS. 10 and 11, the photoconductive film 56 and the charge storage capacitor 55 are electrically connected in series, and thus if a voltage is applied across the upper electrode 58 and the Cs electrode 59 in advance, the electron and hole members of the charge pairs produced in the photoconductive film 56 move to the + and − electrode sides, respectively. As a result, a charge (electron-hole) accumulates in the charge storage capacitor 55. Between the photoconductive film 56 and the charge storage capacitor 55 is provided an electron blocking layer 62 made of a thin insulating layer, which serves as a blocking photodiode for blocking a charge injection from one side to the other.

By putting the TFTs 54 in an open state by means of input signals from gate electrodes $G_1, G_2, G_3, \ldots, G_n$, the charges accumulated in the respective charge storage capacitors 55 due to the foregoing effect can be drawn out through source electrodes $S_1, S_2, S_3, \ldots, S_n$. Since the gate electrodes 52, the source electrodes 53, the TFTs 54, the charge storage capacitors 55, etc. are all provided in the form of an XY matrix, X-ray image information can be obtained two-dimensionally by sequential scanning of the signals inputted to the gate electrodes $G_1, G_2, G_3, \ldots, G_n$.

Incidentally, if the photoconductive film 56 used has photoconductivity not only for radioactive rays such as X-rays but also for visible light, infrared light, etc., the foregoing conventional two-dimensional image detector can also function as a two-dimensional image detector for visible light, infrared light, etc.

The foregoing conventional two-dimensional image detector for radioactive rays uses a-Se for the photoconductive film 56, but a-Se has the following drawbacks: due to the insufficient sensitivity to X-rays (S/N ratio) of a-Se, information cannot be read out unless the charge storage capacitors 55 are sufficiently charged by long X-ray exposure.

Further, in the foregoing conventional two-dimensional image detector for radioactive rays, a dielectric layer 57 is provided between the photoconductive film 56 and the upper electrode 58 in order to reduce current leakage (dark current) and to protect from high voltage. However, since it is necessary to add a step (sequence) for eliminating a residual charge from the dielectric layer 57 after each frame, another drawback of the foregoing conventional two-dimensional image detector for radioactive rays is that it can only be used for pickup of still images.

In order to obtain image data corresponding to moving images, on the other hand, it is necessary to use, instead of a-Se, a photoconductive film 56 which has superior sensitivity to X-rays (S/N ratio) . By improving the sensitivity of the photoconductive film 56, it is possible to sufficiently charge the charge storing capacitor 55 with X-ray exposure of short duration, and since a high voltage need not be applied to the photoconductive film 56, the dielectric layer 57 itself is no longer necessary.

Known examples of this kind of photoconductive material with superior sensitivity to X-rays include CdTe and CdZnTe. Since photoelectric absorption of X-rays by a substance is generally proportional to the fifth power of its effective atomic number, if, for example, the effective atomic number of Se is 34 and that of CdTe is 50, then CdTe can be expected to have a sensitivity of approximately 6.9 times that of Se. However, if replacement of the a-Se in the photoconductive film 56 of the foregoing conventional two-dimensional image detector with CdTe or CdZnTe is attempted, the following problems arise.

With conventional a-Se, a film can be formed by vacuum vapor deposition, and in this case, since the film formation temperature can be set at room temperature, it is easy to form a film on the foregoing active matrix substrate. With CdTe or CdZnTe, on the other hand, film formation by MBE (molecular beam epitaxy) or MOCVD (metal organic chemical vapor deposition) are known; in view of film formation on, in particular, substrates of large surface area, MOCVD is considered most suitable.

However, when forming a film of CdTe or CdZnTe by MOCVD, since the starting materials organic cadmium and organic tellurium have heat decomposition temperatures of approximately 300° C. (for dimethyl cadmium—DMCd) and approximately 400° C. (for diethyl tellurium—DETe) or approximately 350° C. (for diisopropyl tellurium—DiPTe), a high film formation temperature of around 400° C. is needed.

The TFTs 54 formed on the, foregoing active matrix substrate generally use semiconductor layers made of films of a-Si or p-Si, which, in order to improve semiconductor characteristics, are formed while adding hydrogen ($H_2$) at a film formation temperature of 300° C. to 350° C. The heat resistance of a TFT element formed in this manner is approximately 300° C., and exposure to higher temperatures causes the hydrogen to escape from the a-Si or p-Si film, thus impairing semiconductor characteristics.

Accordingly, in consideration of film formation temperature, it is in fact difficult to use MOCVD to form a film of CdTe or CdZnTe on the foregoing active matrix substrate.

To solve these problems, the two-dimensional image detector may be manufactured by forming the active matrix substrate and the photoconductive material layer (semiconductive layer) on different substrates in advance and thereafter laminating the substrates together. Here, the following two methods of laminating the substrates together are considered feasible in order to prevent cross-talk between neighboring pixels. The first method is such that conductivity is achieved only across the two substrates laminated together, while an anisotropic conductive material having an insulating property is used so as to achieve insulation in the substrate plane direction. The second method is such that a conductive material is used independently at each pixel in laminating the substrates together.

These methods make it possible to use semiconductor materials such as CdTe and CdZnTe in the foregoing two-dimensional image detector; such semiconductor materials conventionally could not been used directly on the active matrix substrate in consideration of the film formation temperature of semiconductors and the thermal resistance of the active matrix substrate.

However, these methods lead to problems as described below.

The following description explains the problems of the first method.

Appropriately adapted as the anisotropic conductive material used in the first method is an insulating adhesive (binder resin) in which conductive particles are dispersed, that is, a so-called anisotropic conductive adhesive. Applicable as conductive particles used in the anisotropic conductive adhesive are metal particles such as Au (gold)-plated Ni (nickel) particles, carbon particles, metal-coated plastic particles such as Au/Ni-plated plastic particles, conductive particle composite plastic obtained by mixing in polyurethane transparent conductive particles such as ITO particles as well as Ni particles, etc. As the adhesive, a heat-hardening type, photo-hardening type, or thermoplastic type of adhesive can be used.

The anisotropic conduction principle of the commonly used anisotropic conductive adhesive is described below with reference to FIGS. 12(a) through 12(c).

First of all, as shown in FIG. 12(a), an anisotropic conductive adhesive 64 is applied over one of the substrates to be laminated together (an active matrix substrate 63 in this case). Then, as shown in FIG. 12(b), this substrate and the other substrate (a counter substrate 65 in this case) are laminated together and subjected to pressure and heat so as to adhere to each other. At this time, electrodes each in a protuberance form (protuberance electrodes 66) are formed on one or both of the foregoing substrates. As a result, only conductive particles 67 present in regions of the protuberance electrodes 66 are brought into contact with electrodes above and below the same, as shown in FIG. 12(c). This ensures electric connection between the electrodes on the upper and lower substrates. The regions where the protuberance electrodes 66 are absent (that is, regions corresponding to recessed portions) serve as places accepting bubbles caught upon the laminating of the substrates and portions of the anisotropic conductive adhesive 64 pushed out of between the electrodes when the gap between the substrates are narrowed to not greater than the diameter of the conductive particles 67.

In short, to ensure electric connection between the substrates with use of the anisotropic conductive adhesive 64 at a high yield, the protuberance electrodes 66 are preferably formed on at least one of the substrates.

Incidentally, in the case of the foregoing two-dimensional image detector, to form the protuberance electrode 66 on one of the substrates to be laminated together (the active matrix substrate 63, and the counter substrate 65 having the photoconductive film (semiconductor layer) 56), it is practical to form the protuberance electrodes 66 on the counter substrate 65 having the photocoductive film (semiconductor layer) 56. This is because, as described above, the active matrix substrate 63 is itself formed by repeatedly conducted microstructure processing steps, and to add the protuberance electrode forming step to such a substrate forming process is disadvantageous from the viewpoint of yield.

Therefore, to form the protuberance electrodes on the counter substrate 65 provided with the photoconductive film 56, a method of forming metal protuberances of Ni or the like with a height of 5 μm to 20 μm at desired positions on a surface of the photoconductive film (semiconductor layer) 56 by plating seems feasible.

In the case of the plating method, however, a problem of unevenness of deposited metal arises unless the concentration and temperature of the plating liquid is controlled. For example, according to experiments conducted by the applicant, in the case where Ni is deposited by electroless plating, the unevenness of deposited Ni is aggravated at a ratio of about 5%/1° C.

In the case of the foregoing two-dimensional image detector, though depending on the purpose of application, a large substrate with a surface area of, for example, about 40 cm×50 cm is needed, and when the plating method is applied to such a large-scale substrate, it is difficult to strictly control the concentration and temperature of the plating liquid on the surface so as to achieve uniform distribution of concentration and temperature thereof. As a result, in the case where the protuberance electrodes are formed on the counter substrate by plating, thickness of the plating (that is, height of protuberance electrodes) on the surface varies, thereby leading to a drawback in that, when the active matrix substrate and the counter substrate are laminated together with use of the anisotropic conductive adhesive, regions in which vertical conductivity is achieved and regions in which vertical conductivity is not achieved are both obtained according to the variation in height of the protuberance electrodes.

The following description explains a problem common to the aforementioned first and second methods.

In the case where, to laminate together the substrates on which the active matrix substrate and the photoconductive film (semiconductor layer) have been formed respectively in advance, either (i) the anisotropic conductive adhesive of the first method is used as the connecting material or (ii) the conductive material is applied as the connecting material independently at each pixel according to the second method, connection electrodes and a charge blocking layer are sometimes provided on a surface of the photoconductive film (semiconductor layer). In this case, it is necessary to divide the connection electrodes and the charge blocking layer into independent units respectively corresponding to the pixels. Therefore, patterning of the connection electrodes and the charge blocking layer into such pixel units is needed like in the case of the pixel arrangement of the active matrix substrate, thereby resulting in an increase in the number of processing steps and a rise of the costs.

SUMMARY OF THE INVENTION

The first object of the present invention is to provide a method for manufacturing a two-dimensional image detector having a plurality of protuberance electrodes uniform in height which are formed on one and same substrate.

The second object of the present invention is to provide a method for manufacturing a two-dimensional image detector characterized in that pixels are formed on a connection surface of a semiconductor layer composing the two-dimensional image detector.

To achieve the above-described first object, a method for manufacturing a two-dimensional image detector of the present invention is a method for manufacturing a two-dimensional image detector which includes an active matrix substrate and a counter substrate, the active matrix substrate having a pixel-arrayed layer in which pixel electrodes and switching elements are arrayed in a lattice form substrate, the counter substrate having a semiconductor layer with photoconductivity and an electrode section formed so as to face substantially an entirety of a surface of the pixel-arrayed layer, the active matrix substrate and the counter substrate being electrically connected via a conductive material, and the method is characterized by including the step of (a) forming a plurality of protuberance electrodes on a connection surface of the counter substrate by blasting.

By the foregoing method, grooves can be formed in a predetermined pattern by blasting such as sandblasting, while the flatness of the substrate surface before the processing is maintained. Therefore, it is possible to easily form on one and same substrate a plurality of the protuberance electrodes uniform in height as compared with the protuberance electrodes obtained by the conventional plating. By laminating the counter substrate with a plurality of such protuberance electrodes uniform in height and the active matrix substrate together with use of the anisotropic conductive adhesive, a two-dimensional image detector hardly prone to connection defects can be realized, even in the case where electric connection has to be obtained densely in a large surface area.

Incidentally, another method of forming a plurality of the protuberance electrodes uniform in height on the basis of the identical principles is a method of forming the grooves on the substrate surface by etching. The etching, however, makes the manufacturing process more complicated since, in the case where a carrier blocking layer and connecting electrodes are present on the substrate surface, an etching liquid or an etching gas has to be changed so as to be suited to each film.

In formation of the grooves by sandblasting, on the other hand, since the grooves are physically formed by causing the ceramic particles to collide against the substrate surface, even in the case where the carrier blocking layer or the connecting electrodes, for example, are present on the substrate surface, the grooves can be formed by boring these films through one step. Therefore, this method is superior from the viewpoints of simplification of manufacturing process and lowering of costs.

The foregoing step (a) preferably includes the sub-steps of a. forming a mask having openings in a predetermined pattern on the electrode section composed of connecting electrodes, a carrier blocking layer, etc., b. processing the mask-covered surfaces of the connecting electrodes and semiconductor layer by blasting, so that at the openings of the mask the connecting electrodes and the carrier blocking layer are removed while grooves are formed on the semiconductor layer, and c. removing the mask.

With the foregoing arrangement, in addition to the effect of easier formation of a plurality of protuberance electrodes uniform in height on one and same substrate, the following effect can be achieved: the patterning of connecting electrodes formed on the semiconductor layer surface and the formation of the protuberances (grooves in a lattice form) can be carried out through one and same step, thereby making the manufacturing method superior from the viewpoints of simplification of manufacturing process and lowering of costs.

To achieve the aforementioned second object, another method for manufacturing a two-dimensional image detector of the present invention is a method for manufacturing a two-dimensional image detector which includes an active matrix substrate and a counter substrate, the active matrix substrate having a pixel-arrayed layer in which pixel electrodes and switching elements are arrayed in a lattice form substrate and the counter substrate having a semiconductor layer with photoconductivity and an electrode section formed so as to face substantially an entirety of a surface of the pixel-arrayed layer, the active matrix substrate and the counter substrate being electrically connected via a conductive material, and the method is characterized by including the step of (a) forming a plurality of pixels on a connection surface of the counter substrate by blasting.

The foregoing method, since pixels are formed by blasting, requires only a device which causes ceramic particles to collide against the substrate surface, and does not need an etching device. Moreover, in the case where a carrier blocking layer and a pixel electrode are present on the surface substrate, grooves can be easily formed by boring these films through one step. Therefore, this method is superior from the viewpoints of simplification of manufacturing process and lowering of costs.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

The following description will explain an embodiment of the present invention while referring to FIGS. 1 through 5.

Figure 1:
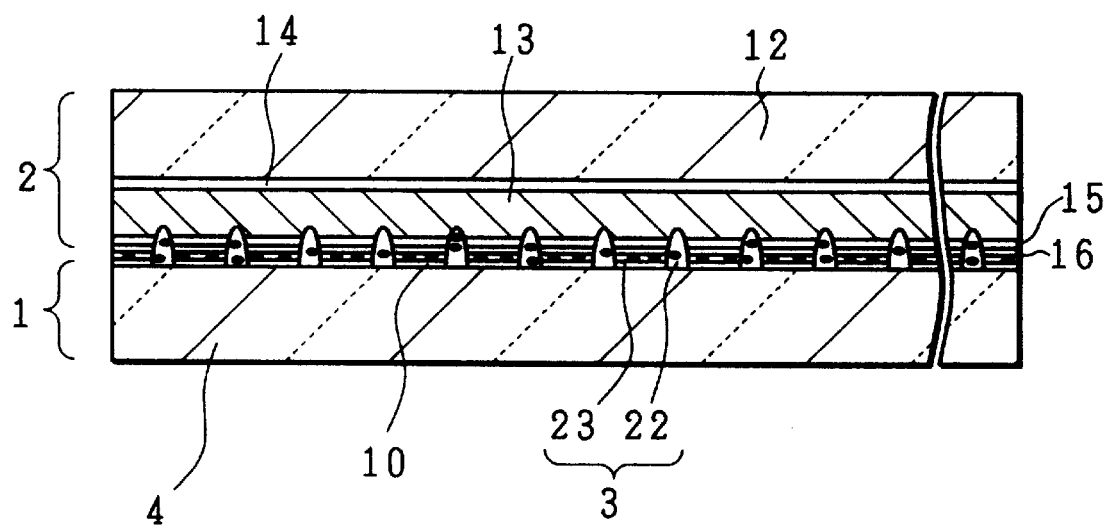
FIG. 1 is a cross-sectional view schematically showing the overall structure of a two-dimensional image detector according to one embodiment of the present invention.
Figure 2:
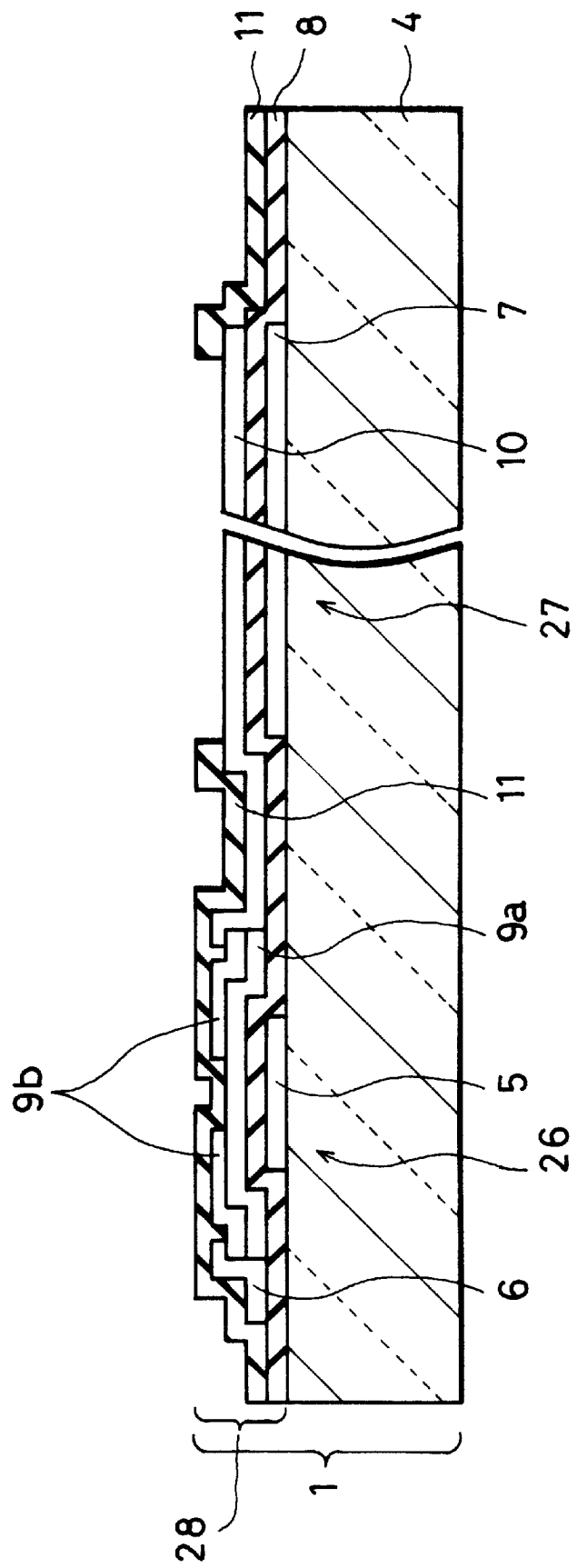
FIG. 2 is a cross-sectional view schematically showing the structure of one pixel of an active matrix substrate according to the foregoing embodiment of the present invention.

FIG. 1 is a cross-sectional view illustrating the basic structure of an entire two-dimensional image detector in accordance with the present embodiment, and FIG. 2 is a cross-sectional view illustrating in detail the basic structure of one pixel of the same two-dimensional image detector.

As shown in FIGS. 1 and 2, the two-dimensional image detector according to the present embodiment comprises an active matrix substrate 1 provided with TFTs (thin-film transistors) 26 as switching elements and pixel electrodes 10, and a counter substrate 2 provided with a semiconductor layer 13. The two substrates are laminated together with use of an anisotropic conductive adhesive 3 which is an anisotropic conductive material with conductivity in only one direction. Here, the "anisotropic conductive material" is a general term referring to materials having anisotropy in the conductive property. In the present embodiment, pixels are arrayed in matrix at 150 µm pitch throughout a substantially entire surface of the 40 cm×50 cm active matrix substrate 1.

The following will explain the detailed structure of one pixel of the foregoing active matrix substrate 1 with reference to the cross-sectional view of FIG. 2.

The active matrix substrate 1 is made up of electrode lines (gate electrodes 5 and source electrodes 6), charge storage capacitors (Cs) 27, thin film transistors (TFTs) 26 as switching elements, etc., arranged in an XY matrix on a glass substrate 4. In other words, the electrodes 5 and 6 (electrode lines), the charge storage capacitors 27, and the TFTs 26 make up a pixel layer 28 of the active matrix substrate 1.

The glass substrate 4 is comprised of a non-alkaline glass substrate (such as #7059 and #1737 available from Corning Industries, Inc.), and is provided with the gate electrode 5, comprised of a metal film of Al (aluminum), Ta (tantalum), etc. The gate electrode 5 is obtained by sputtering deposition of a film of Al, Ta, etc. approximately 3000 Å in thickness, followed by patterning in a desired shape. At this time, a Cs electrode 7 of the charge storage capacitor 27 is also provided.

Next, an insulating film 8 approximately 3500 Å in thickness is provided by CVD (chemical vapor deposition) of $SiN_x$, $SiO_x$, etc. The insulating film 8 functions as a gate insulating film for the TFT 26, and as a dielectric layer between the electrodes of the charge storage capacitor 27. Incidentally, for the insulating film 8, an anodic oxidation film provided by anodizing the gate electrode 5 and the Cs electrode 7 may be used along with the $SiN_x$, $SiO_x$, etc.

Next, an a-Si film (i layer) 9a, which forms a channel section of the TFT 26, and an a-Si film ($n^+$ layer) 9b, which provides contact between the source and drain electrodes, are provided with thicknesses of about 1000 Å and about 400 Å, respectively, by CVD followed by patterning in a desired shape.

Next, a source electrode 6 and a drain electrode (also serving as the pixel electrode 10), which are metal films of Ta, Al, etc., are provided. The source electrode 6 and the drain electrode are obtained by sputtering deposition of the metal film, followed by patterning in a desired shape. Incidentally, the pixel electrode 10 and the drain electrode may be provided separately, and it is also possible to use a transparent electrode of ITO (indium tin oxide), etc. for the pixel electrode 10.

Then, in order to insulate and protect all areas other than the opening of the pixel electrode 10, an insulating protective film 11 is provided. The insulating protective film 11 is obtained by forming an insulating film of $SiN_x$, $SiO_x$, etc. approximately 6000 Å in thickness by CVD, followed by patterning in a desired shape. Instead of an inorganic insulating film, the insulating protective film 11 may be an organic film of acrylic, polyimide, etc. In this way, the active matrix substrate 1 is completed.

Incidentally, in the present embodiment, the TFT elements of the active matrix substrate 1 are a-Si TFTs 26 having an inverse-staggered structure, but there is no limitation to this; it is also possible to use p-Si, and to use a staggered structure. Further, the active matrix substrate 1 may be prepared by the same process as that used for active matrix substrates prepared in the process of manufacturing liquid crystal display devices.

Figure 3:
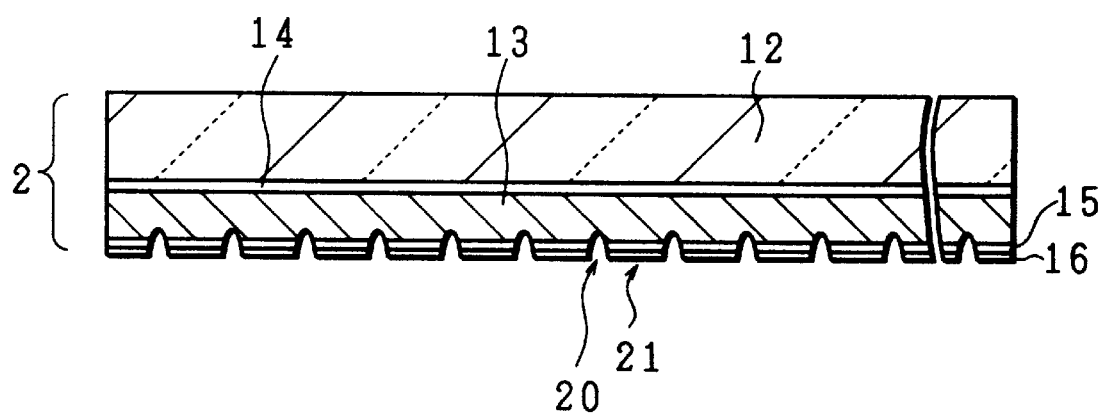
FIG. 3 is a cross-sectional view schematically showing the structure of a counter substrate according to the foregoing embodiment of the present invention.
Figure 4:
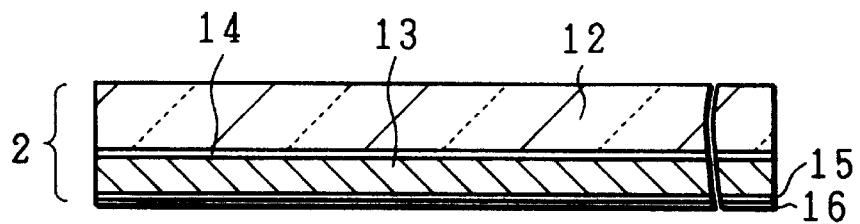
FIGS. 4(a) through 4(d) are explanatory views showing a manufacturing process of a counter substrate according to the foregoing embodiment of the present invention.
Figure 4:
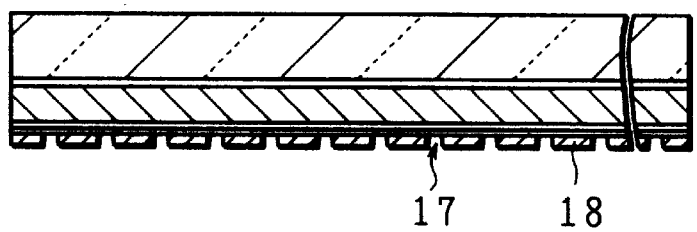
Figure 4:
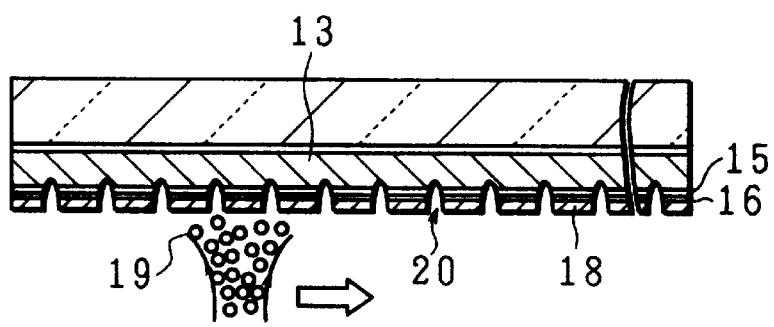
Figure 4:
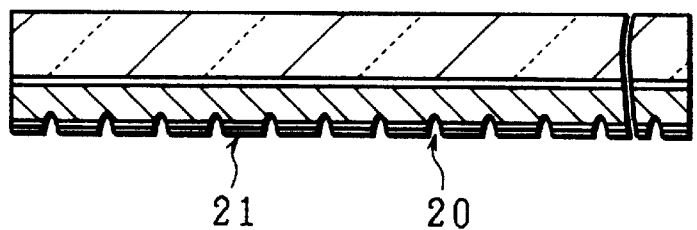

The counter substrate 2, on the other hand, includes a supporting substrate 12 made of a material having transmissivity for X-rays, and the semiconductor layer 13 formed on the supporting substrate 12, as shown in the cross-sectional view of FIG. 3. For the supporting substrate 12 of the present invention, a substrate of glass, ceramics, silicon, etc. can be used. Incidentally, the supporting substrate 10 in the present embodiment is a substrate of glass, which has superior transmissivity for both X-rays and visible light, with a thickness of 0.7 mm to 1.1 mm. This type of substrate transmits almost all X-rays of 40 keV to 100 keV.

The following description will explain the manufacturing method of the foregoing counter substrate 2, with reference to FIGS. 4(a) through 4(d).

First, an upper electrode 14 comprised of a metal such as Au (gold) or ITO is provided over substantially the entirety of one surface of the supporting substrate 12, as shown in FIG. 4(a). However, when the two-dimensional image detector of the present embodiment is used for detecting images in visible light, it is necessary to use as the upper electrode 14 an ITO electrode, which has transmissivity for visible light.

Next, a semiconductor layer 13, composed of a polycrystalline film made of CdTe, CdZnTe, etc. having a thickness of approximately 0.5 mm, is provided on the upper electrode 14 by MOCVD. MOCVD is suited to film formation on a substrate of large surface area, and is capable of forming, at a temperature of 400° C. to 500° C., a film of such a material as organic cadmium (dimethyl cadmium (DMCd), etc.), organic tellurium (diethyl tellurium (DETe), diisopropyl tellurium (DiPTe), etc.), or organic zinc (such as diethyl zinc (DEZn), diisopropyl zinc (DiPZn), dimethyl zinc (DMZn), etc.).

Incidentally, instead of MOCVD, a polycrystalline film of CdTe, CdZnTe, etc. may be formed by another method such as proximity sublimation or paste burning. Further on the polycrystalline film, CdS is deposited by the same film formation to a thickness of approximately 1 μm. CdS forms a hetero junction with the foregoing CdTe or CdZnTe, thereby functioning as carrier blocking layers 15 that prevent carriers from intruding from one side to the other side. In other words, the CdS functions as a blocking photodiode.

Incidentally, instead of the carrier blocking layers 15 of the foregoing hetero junction type, those of a PIN junction type, an MIS junction type, or a Schottky junction type may be used. In such a case, the carrier blocking layer 15 may be formed using, instead of the foregoing CdS, any one suited to the junction type, selected from among a p-type impurity-doped semiconductor layer, an n-type impurity-doped semiconductor layer, a thin dielectric layer, etc. Further, a connecting electrode 16 approximately 2000 Å in thickness composed of a conductive film of Cr (chromium), Al, ITO, etc. is formed on the carrier blocking layer 15 by sputtering deposition.

Next, as shown in FIG. 4(b), a mask 18 having an opening section 17 is formed on a surface of the counter substrate 2 (the surface to be later brought into contact with the active matrix substrate 1). The mask 18 is formed with photoresist having an appropriate elasticity which is patterned by photolithography. Here, the photoresist is patterned so that the resist is left at positions which will face the pixel electrodes 10 on the active matrix substrate 1 when the counter substrate 2 is laminated on the active matrix substrate 1, while the other region which is in a lattice form is opened. The pitch of the lattice is set to 150 μm in accordance with the pixel pitch.

Next, as shown in FIG. 4(c), grinding particles 19 are sprayed against the counter substrate 2 on which the mask 18 having the opening section 17 is formed; the counter substrate 2 is subjected to so-called sandblasting.

Ceramic particles with a diameter of 5 μm to 20 μm are used as grinding particles 19. As a result, portions of the substrate surface covered with the mask are protected by the resist with elasticity, whereas portions of the substrate surface corresponding to the opening section 17 are ground. Accordingly, grooves 20 in a lattice form in accordance with the opening section pattern are formed on the substrate surface. At this time, in forming the grooves 20, it is important to, by sandblasting, bore the connecting electrode 16 and the carrier blocking layer 15 formed on the counter substrate 2 and grind the semiconductor layer 13 as well. The depth of the grooves 20 is determined depending on a thickness of the anisotropic conductive adhesive and a diameter of the conductive particles as will be described later, but it is preferably 5 μm to 20 μm. A width of the grooves 20 may be set to 20 μm to 50 μm.

Finally, the foregoing mask 18 is removed by an organic solvent or an alkali peeling liquid. In this way, the counter substrate 2 on whose surface grooves 20 in a lattice form are formed is completed as shown in FIG. 4(d). The portions which remain, not having been ground due to the mask 18, serve as protuberance-form electrodes (protuberance electrodes 21).

Figure 5:
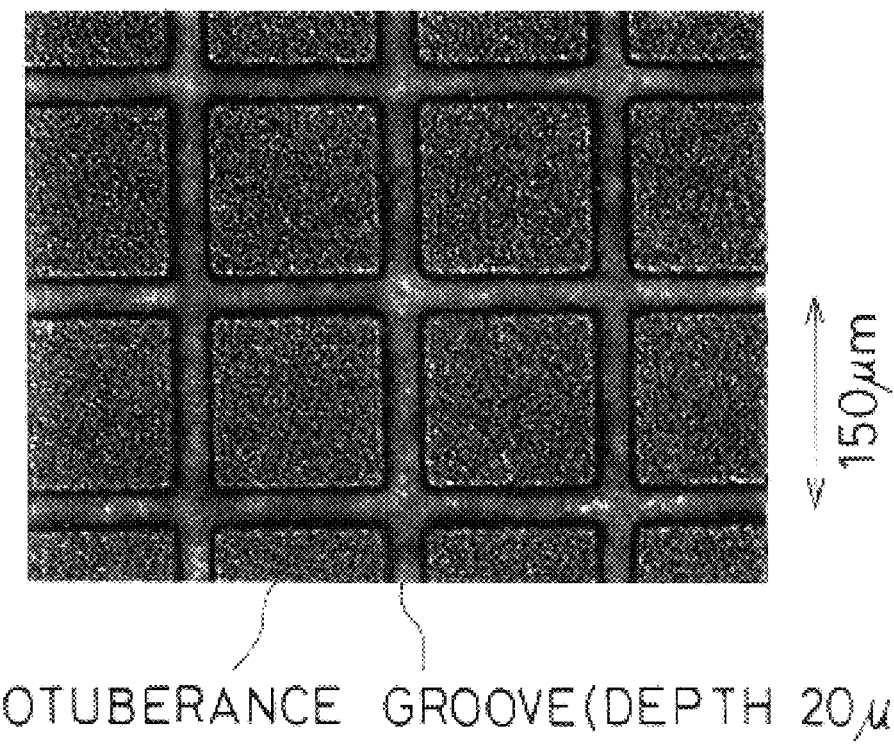
FIG. 5 is an explanatory view based on an enlarged photograph taken from above, showing protuberances arrayed in a lattice form which are formed by sandblasting of the present invention.

Incidentally, an example set of conditions of the sandblasting for obtaining grooves in a lattice form with a depth of 20 μm is shown in Table 1 below. FIG. 5 is an enlarged photograph taken from above, which shows the protuberances having been formed in the lattice form under the processing conditions shown in Table 1.

TABLE 1

| | |
|---|---|
| TYPE OF GRINDING MATERIAL | ALUMINA |
| SIZE OF GRINDING MATERIAL | APPROXIMATELY φ7 mm |
| PROCESSING PRESSURE | 5.0 Kg/cm$^2$ |
| TRANSPORT SPEED | 200 mm/min |
| GUN MOVING SPEED | 20 m/min |
| GUN MOVING WIDTH | 200 mm |
| GUN DISTANCE | 30 mm |
| PROCESSING PASSAGE | 5 TIMES |

The substrates (active matrix substrate 1 and counter substrate 2) formed through the foregoing steps are assembled so that the pixel electrodes 10 align with the connecting electrodes 16, and a gap therebetween is filled with the anisotropic conductive adhesive 3, as shown in FIG. 1. The substrates in this state are subjected to pressure so as to adhere to each other, and the two-dimensional image detector of the present invention is completed. Pressure is applied by oil hydraulic press, roller press, autoclave press, etc. To realize press with uniform pressure with respect to a large surface area, however, autoclave press using high-pressure gas is effective.

Here, an adhesive (binder resin) 22 with an insulating property in which conductive particles 23 are dispersed is used as the anisotropic conductive adhesive 3. Adaptable so as to be used as the conductive particles 23 are: particles of metal such as Ni (nickel) or Ag (silver); metal particles such as Au-plated Ni particles; carbon particles; metal particles such as Au/Ni-plated plastic particles; and conductive particle composite plastic obtained by mixing in polyurethane transparent conductive particles such as ITO particles as well as Ni particles. Adaptable so as to be used as the adhesive 22 having an insulating property are heat-hardening type, photo-hardening type, and thermoplastic type of adhesives, and any one may be selected from among these depending on the purpose of use. In the present embodiment, metal-coated plastic particles with a diameter of 10 μm are adapted so as to be used as the conductive particles 23, and epoxy-based adhesive of the heat-hardening type with resistivity of not less than $10^{14}$ Ωcm as the insulating adhesive 22.

Besides, the anisotropic conductive adhesive 3 can be classified into a paste type and a film type. The paste-type adhesive can be easily applied to a substrate with a large surface area by screen printing or the like. The film-type adhesive excels in uniformity of thickness of the film, and the use of the same therefore ensures that uniform thickness of the adhesive is easily achieved when substrates with large surface areas are laminated together. Either of these types may be used.

Thus, the protuberance electrodes 21 have already been provided on the counter substrate 2 when the active matrix substrate 1 and the counter substrate 2 are laminated together, and only the conductive particles 23 present in the regions of the protuberance electrodes 21 are brought into contact with the pixel electrodes 10 and the connecting electrodes 16, at which the pixel electrodes 10 and the connecting electrodes 16 are electrically connected. In regions where no protuberance electrode 21 exist (that is, regions corresponding to recessed portions) serve as places accepting bubbles caught upon the laminating of the substrates and portions of the anisotropic conductive adhesive 64 pushed out of between the electrodes when the gap between the substrates are narrowed to not greater than the diameter of the conductive particles 67.

In the case of the present invention, as described above, since the protuberance electrodes 21 are formed by sandblasting, the grooves 20 in a predetermined pattern are formed, while the flatness of the substrate surface before the processing is maintained. Therefore, it is possible to easily form on one and same substrate a plurality of the protuberance electrodes 21 uniform in height as compared with the protuberance electrodes obtained by the conventional plating. If the counter substrate 2 with a plurality of such protuberance electrodes 21 with a uniform height is laminated on the active matrix substrate 1 with use of the anisotropic conductive adhesive 3, it is possible to make gaps between the protuberance electrodes 21 and the pixel electrodes 10 uniform throughout the region. As a result, even in the case where electric connection has to be obtained densely in a large surface area, a two-dimensional image detector hardly prone to connection defects can be realized.

Incidentally, another method of forming a plurality of the protuberance electrodes 21 with a uniform height on the basis of the identical principles is a method of forming the grooves 20 on the substrate surface by etching. The etching, however, makes the manufacturing process more complicated since, in the case where the carrier blocking layer 15 and the connecting electrode 16 are present on the substrate surface, an etching liquid or an etching gas has to be changed so as to be suited to each film.

In formation of the grooves 20 by sandblasting, on the other hand, since the grooves 20 are physically formed by causing the grinding particles 19 to collide against the substrate surface, even in the case where the carrier blocking layer 15 or the connecting electrode 16 are present on the substrate surface, the grooves 20 can be formed by boring these films through one and same step. Therefore, this method is superior from the viewpoints of simplification of manufacturing process and lowering of costs.

Moreover, since by sandblasting the carrier blocking layer 15 and the connecting electrode 16 formed on the counter substrate 2 are separated into pieces respectively corresponding to the pixels, cross-talk of carrier can be prevented from occurring across neighboring pixels.

As described above, the method for manufacturing a two-dimensional image detector of the present embodiment is a method for manufacturing a two-dimensional image detector which includes an active matrix substrate 1 and a counter substrate 2, the active matrix substrate 1 having a pixel-arrayed layer 28 in which pixel electrodes 10 and switching elements 26 are arrayed in a lattice form, the counter substrate 2 having a semiconductor layer 13 with photoconductivity and an electrode section which is composed of a connecting electrode 16, a carrier blocking layer 15, etc., and is formed so as to face substantially an entirety of a surface of the pixel-arrayed layer 28, the active matrix substrate 1 and the counter substrate 2 being electrically connected via a conductive material such as an anisotropic conductive adhesive 3, and the method is characterized by including the step of (a) forming a plurality of protuberance electrodes on a connection surface of the counter substrate by blasting.

Furthermore, the foregoing step (a) includes the sub-steps of a. forming a carrier blocking layer 15 and connecting electrodes 16 over substantially an entirety of a surface of the semiconductor layer 13 of the counter substrate 2, b. forming on the connecting electrodes 16 a mask 18 having openings 17 in a predetermined pattern, c. processing, by blasting, surfaces of the connecting electrodes 16 and semiconductor layer 13 which is covered with the mask 18, so that at the openings 17 of the mask 18 the connecting electrodes 16 and the carrier blocking layer 15 are removed while grooves 20 are formed on the semiconductor layer 13, and d. removing the mask 18.

[Second Embodiment]

Figure 6:
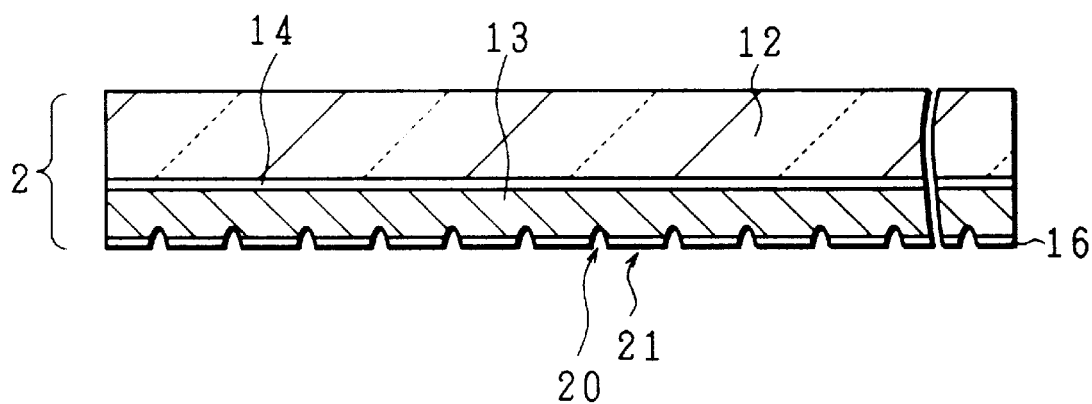
FIG. 6 is a cross-sectional view schematically showing the structure of a counter substrate according to another embodiment of the present invention.

The following description will explain another embodiment of the present invention, with reference to FIG. 6. Incidentally, the members having the same structure (function) as those in the above-mentioned embodiment will be designated by the same reference numerals and their description will be omitted.

In a two-dimensional image detector in accordance with the present embodiment, a counter substrate 2 as shown in the cross-sectional view of FIG. 6 is used. In the first embodiment described above, as shown in the cross-sectional view of FIG. 3, a counter substrate 2 formed by first providing the semiconductor layer 13, followed by formation of the carrier blocking layer 15 and the connecting electrode 16, but the counter substrate 2 in the present embodiment uses a material which has dark resistance sufficiently high for semiconductor material and has a superior S/N ratio, and has the same structure as that shown in FIG. 3 except that the carrier blocking layers 15 are omitted.

The structure of the two-dimensional image detector of the present embodiment other than the foregoing aspect is identical to that of the first embodiment. The counter substrate 2 of the present embodiment can be formed by an identical method to that for the first embodiment above described with reference to FIGS. 4(a) through 4(d).

As described above, a method for manufacturing a two-dimensional image detector of the present embodiment is such that the step of forming a plurality of protuberance electrodes 21 on the connection surface of the counter substrate 2 by blasting includes the sub-steps of a. forming connecting electrodes 16 over substantially an entirety of a surface of the semiconductor layer 13 of the counter substrate 2, b. forming on the connecting electrodes 16 a mask 18 having openings 17 in a predetermined pattern, c. processing, by blasting, surfaces of the connecting electrodes 16 and semiconductor layer 13 which is covered with the mask 18, so that at the openings 17 of the mask 18 the connecting electrodes 16 are removed while grooves 20 are formed on the semiconductor layer 13, and d. removing the mask 18.

[Third Embodiment]

Figure 7:
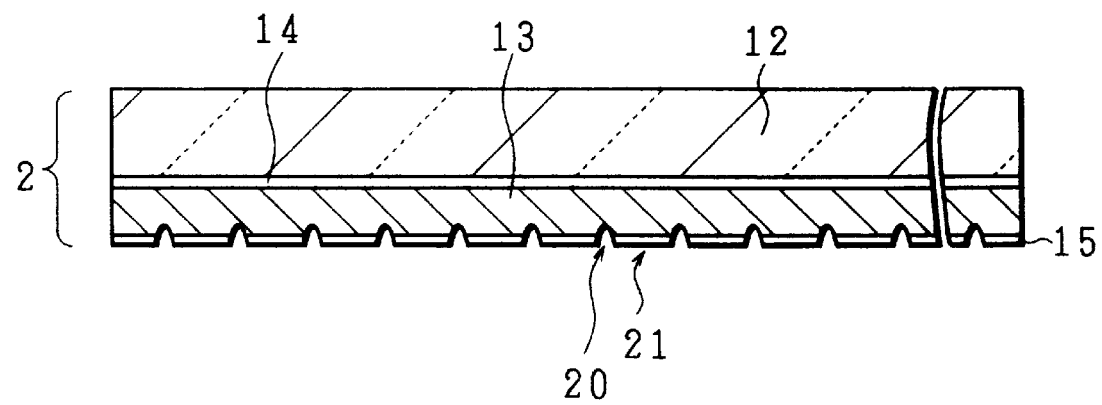
FIG. 7 is a cross-sectional view schematically showing the structure of a counter substrate according to still another embodiment of the present invention.

The following description will explain still another embodiment of the present invention with reference to FIG. 7. The members having the same structure (function) as those in the above-mentioned embodiments will be designated by the same reference numerals and their description will be omitted.

A two-dimensional image detector of the present embodiment uses a counter substrate 2 shown in the cross-sectional view of FIG. 7. Specifically, in the aforementioned first embodiment, as shown in FIG. 3, the counter substrate 2 is formed by first providing the semiconductor layer 13, followed by formation of the carrier blocking layer 15 and the connecting electrode 16. In contrast, the counter substrate 2 in the present embodiment is arranged so that the carrier blocking layer 15 is formed with a p-type impurity-doped or n-type impurity-doped semiconductor material with low resistance, and the connecting electrodes 16 are omitted.

The structure of the two-dimensional image detector of the present embodiment other than the foregoing aspect is identical to that of the first embodiment. The counter substrate 2 of the present embodiment can be formed by an identical method to that for the first embodiment above described with reference to FIGS. 4(a) through 4(d).

As described above, the two-dimensional image detector of the present embodiment is characterized in that the carrier blocking layer constituting an electrode section is formed with a p-type impurity-doped or n-type impurity-doped semiconductor material with low resistance.

[Fourth Embodiment]

Figure 8:
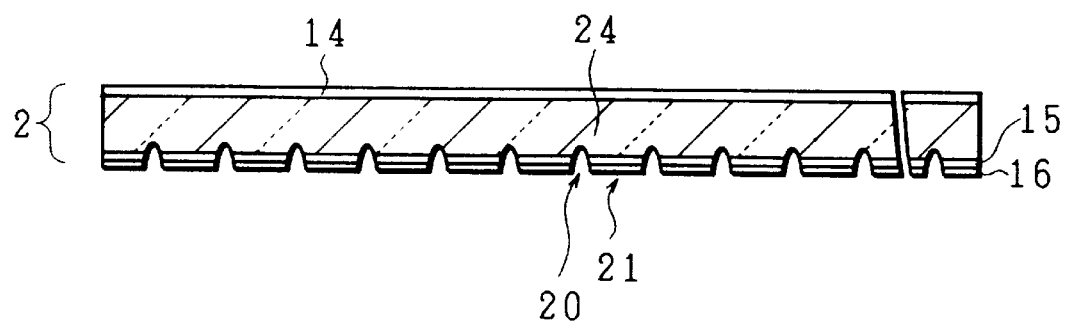
FIG. 8 is a cross-sectional view schematically showing the structure of a counter substrate according to still another embodiment of the present invention.

The following description will explain still another embodiment of the present invention with reference to FIG. 8. The members having the same structure (function) as those in the above-mentioned embodiments will be designated by the same reference numerals and their description will be omitted.

A two-dimensional image detector of the present embodiment uses a counter substrate 2 shown in the cross-sectional view of FIG. 8. In the aforementioned first embodiment, as shown in the cross-sectional view of FIG. 3, the counter substrate 2 is formed by first providing the semiconductor layer 13, followed by formation of the carrier blocking layer 15 and the connecting electrode 16. In contrast, the counter substrate 2 in the present embodiment uses a semiconductor substrate 24 having photoconductivity with respect to X-rays as supporting substrate, as shown in FIG. 8.

A compound semiconductor such as CdTe or CdZnTe may be used for forming the semiconductor substrate 24. The semiconductor substrate 24 is formed approximately 0.5 mm in thickness.

For the aforementioned semiconductor substrate 24, a crystalline substrate can be easily formed by the Bridgman method, the gradient freezing method, the travel heating method, or the like. In the counter substrate 2 of the present embodiment, an upper electrode 14 is formed over substantially the entirety of one surface of the semiconductor substrate 24, with a metal such as Al having transmissivity for X-rays. Regarding the other side of the semiconductor substrate 24, as in the first embodiment, the carrier blocking layer 15 and the connecting electrode 16 are formed over substantially the entirety of the surface on the side. Thereafter, the semiconductor substrate 24 is processed through the same process shown in FIGS. 4(a) through 4(d), whereby the counter substrate 2 is completed.

[Fifth Embodiment]

Figure 9:
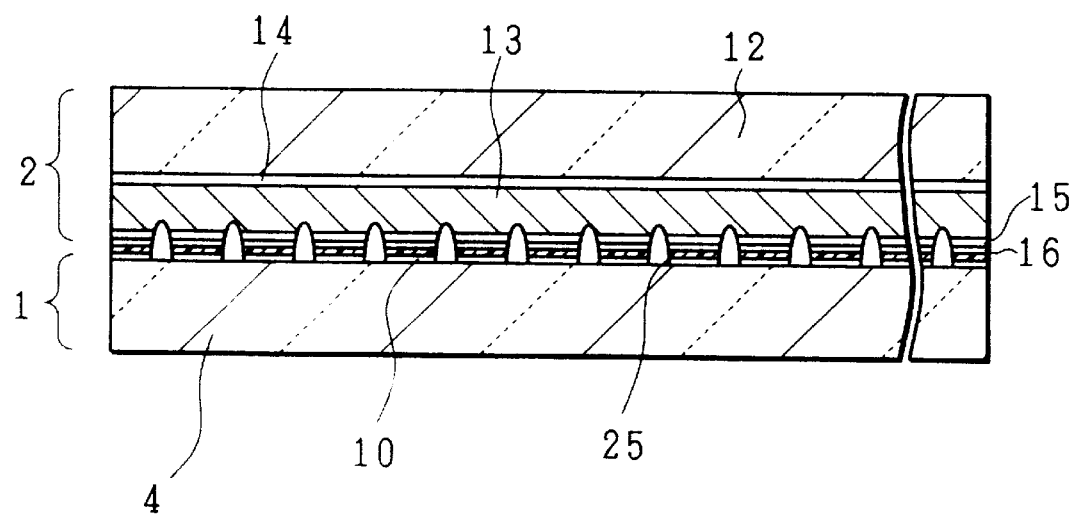
FIG. 9 is a cross-sectional view schematically showing the structure of another two-dimensional image detector of the present invention.
Figure 10:
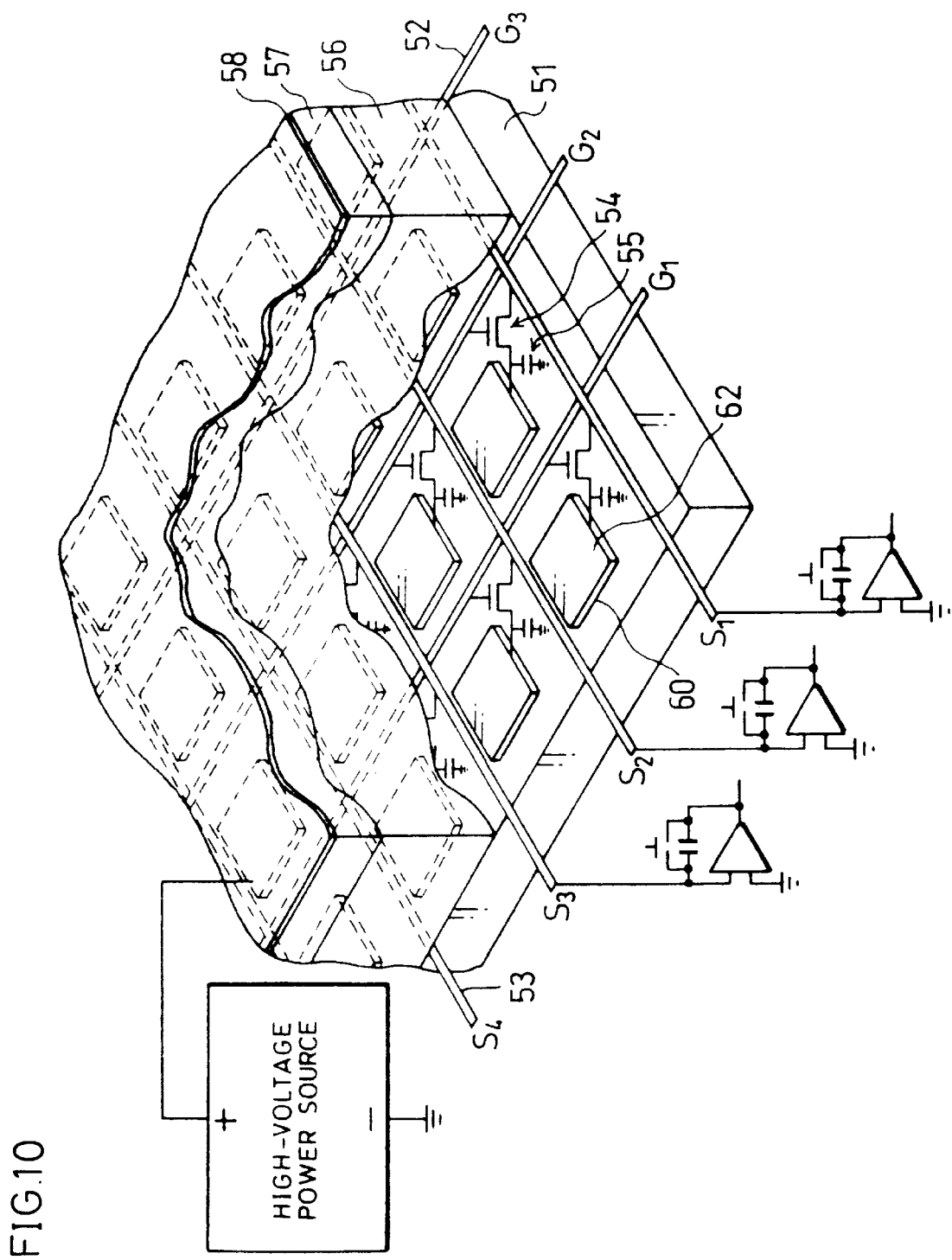
FIG. 10 is a perspective view schematically showing the structure of a conventional two-dimensional image detector.
Figure 11:
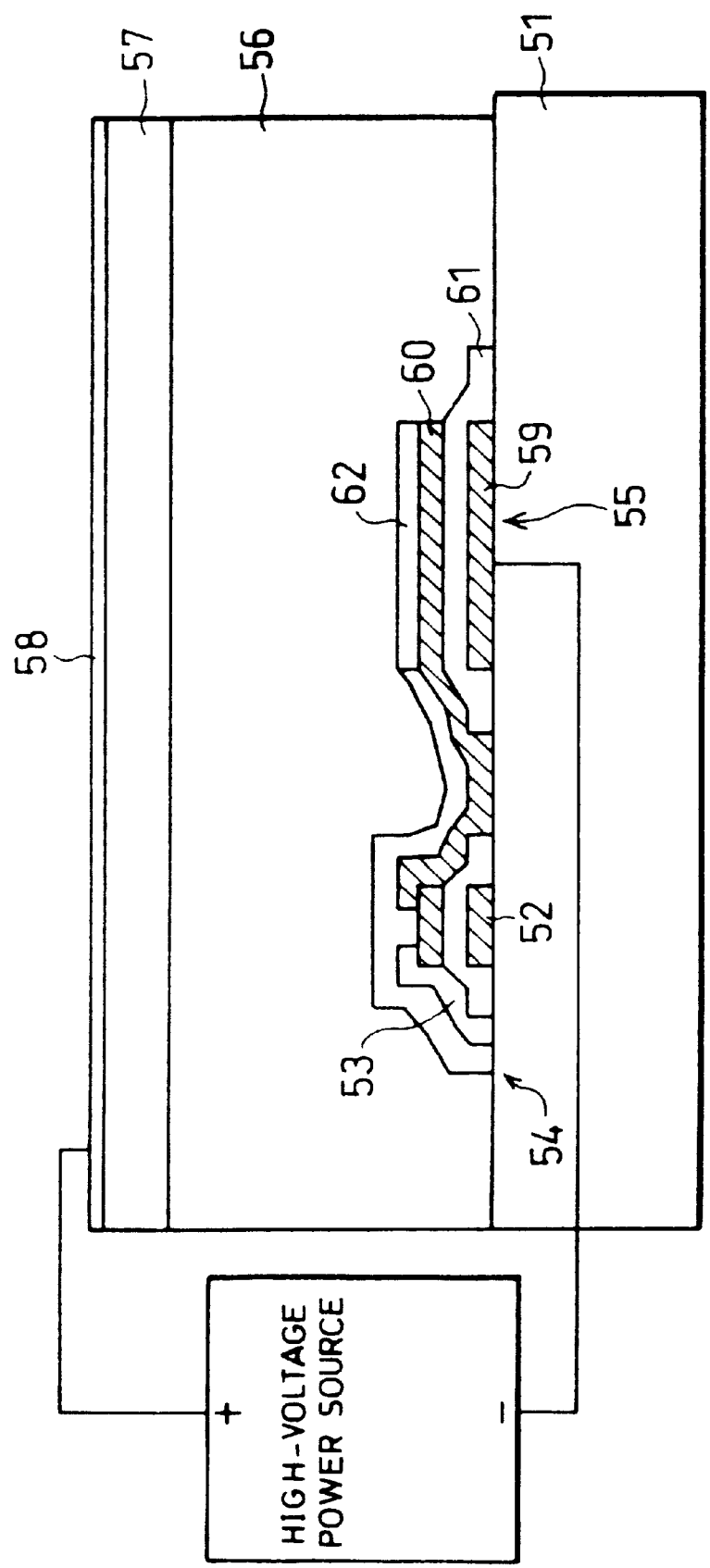
FIG. 11 is a cross-sectional view showing the structure of one pixel of the conventional two-dimensional image detector shown in FIG. 10.
Figure 12A:
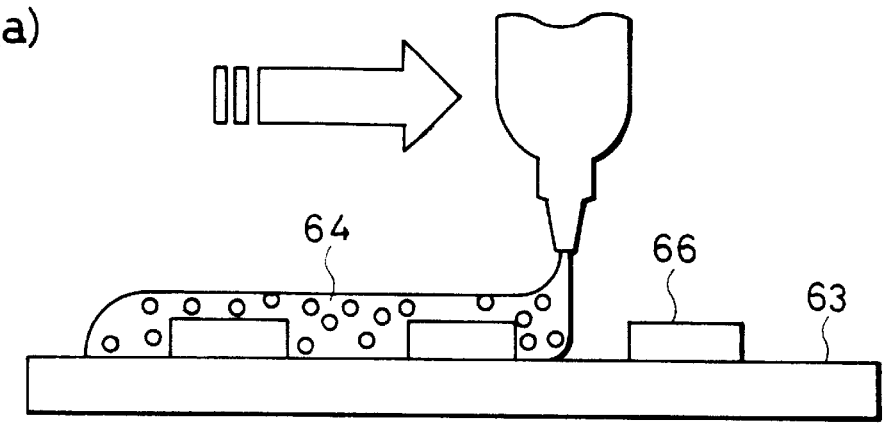
FIGS. 12(a) through 12(c) are explanatory view showing a process of laminating substrates together with use of an anisotropic conductive adhesive, as well as principles of anisotropic conductivity of the anisotropic conductive adhesive.
Figure 12B:
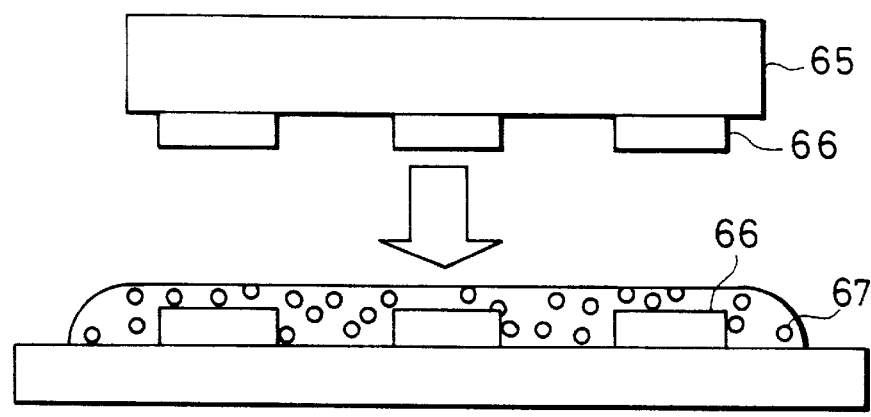
Figure 12C:
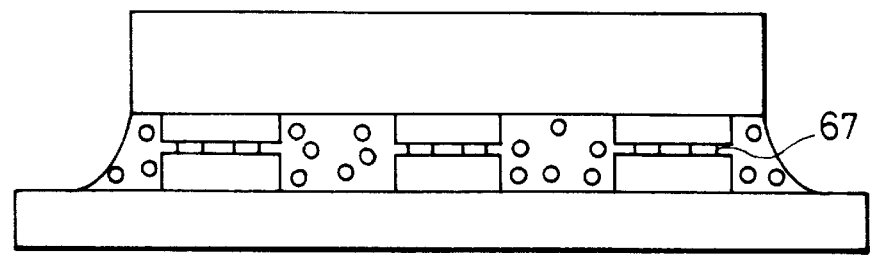

The following description will explain still another embodiment of the present invention with reference to FIG. 9. The members having the same structure (function) as those in the above-mentioned embodiments will be designated by the same reference numerals and their description will be omitted.

A two-dimensional image detector of the present embodiment has a structure which differs from that of the first embodiment in that not the anisotropic conductive adhesive 3 shown in FIG. 1 but a conductive adhesive 25 patterned into units respectively corresponding to the pixels is used for connecting the active matrix substrate 1 and the counter substrate 2. The structure of the two-dimensional image detector of the present embodiment other than the foregoing aspect is identical to that of the first embodiment.

The foregoing conductive connecting agent 25 is preferably a photosensitive resin with a conductive pigment applied thereto, so as to be patterned by photolithography into units respectively corresponding to the pixels. More specifically, for example, an acrylic photosensitive resin in which fine particles of carbon are dispersed can be adapted so as to be used as the conductive connecting agent 25. Apart from this, conductive adhesive paste may be provided in a desired pattern by printing.

The two-dimensional image detector of the present embodiment shown in FIG. 9 may be produced by, for example, the following method.

First of all, the active matrix substrate 1 and the counter substrate 2 are formed in the manner identical to that in the first through fourth embodiments. Next, a photosensitive conductive resin obtained by dispersing fine particles of carbon in an acrylic photosensitive resin is applied over the entirety of pixel region on the active matrix substrate 1 so that a film of the same with a uniform thickness is formed.

Thereafter, the photosensitive conductive resin covered with a photo mask in a pattern corresponding to the pattern of the pixel electrodes is exposed, and unnecessary portions of the photosensitive conductive resin are removed from the substrate in accordance with the exposure pattern, by a developing operation with use of developing liquid. As a result, the conductive connecting members 25 provided in a pattern matching the pixel electrode pattern can be formed. Each conductive connecting member 25 may be formed in a desired shape, for example, a cylindrical shape.

Furthermore, the active matrix substrate 1 on which the conductive connecting members 25 are formed and the counter substrate 2 are laminated together with an adhesive sealing material (not shown) provided therebetween, so that the pixel electrodes 10 align with the connecting electrodes 16. As a result, the two-dimensional image detector is completed as shown in FIG. 9.

In the present embodiment, no anisotropic conductive adhesive is used in the connecting material, but since the pixels in the connection interface of the counter substrate are formed by sandblasting (separately provided in a lattice form) as in the first through fourth embodiments, an effect of no cross-talk across neighboring pixels occurring in the connecting electrodes and the carrier blocking layer can be achieved.

Accordingly, the processing of the counter substrate connection surface by sandblasting is effective not only for formation of the protuberance electrodes but also for mere formation of pixels.

Incidentally, the above descriptions of the foregoing first through fifth embodiments take as examples the cases in which CdTe, CdZnTe, or the like is used as semiconductor material with sensitivity for X-rays (radioactive rays), but there is no limitation to these; it is also possible to use other semiconductor such as a-Se conventionally used, which is applicable to any one of two-dimensional image detector formed in a manner such that the active matrix substrate and the counter substrate are separately produced and the two substrates are laminated together with use of an anisotropic conductive adhesive or conductive connecting agent provided in a desired pattern of units respectively corresponding to the pixels.

Furthermore, the above descriptions of the first through fifth embodiments mainly explain the case of a two-dimensional image detector for X-rays (radioactive rays), but in the case where semiconductor (photoconductor) used has photoconductivity not only for radioactive rays such as X-rays but also for visible light, infrared light, etc., the foregoing two-dimensional image detector can also function as a two-dimensional image detector for visible light, infrared light, etc.

In this case, however, it is necessary to use a transparent electrode made of ITO or the like which transmits visible light, infrared light, etc. as the upper electrode which is disposed at a light incident side to the semiconductor (photoconductor). Further, it is also necessary to optimize the thickness of the semiconductor (photoconductor) according to an efficiency of absorption of visible light, infrared light, etc.

As described above, a first method for manufacturing a two-dimensional image detector of the present invention is a method for manufacturing a two-dimensional image detector which includes an active matrix substrate and a counter substrate, the active matrix substrate having a pixel-arrayed layer composed of electrode lines provided in a lattice form, a plurality of switching elements provided at respective lattice points, and charge storage capacitors having pixel electrodes connected to the electrode lines through the switching elements, the counter substrate having an electrode section formed so as to face substantially an entirety of a surface of the pixel-arrayed layer and a semiconductor layer with photoconductivity to be between the pixel-arrayed layer and the electrode section, the active matrix substrate and the counter substrate being electrically connected via a conductive material so that the pixel-arrayed layer of the active matrix substrate and the semiconductor layer of the counter substrate face each other, and the method includes the step of forming a plurality of protuberance electrodes on a connection surface of the counter substrate by sandblasting.

By the foregoing method, the processing by sandblasting enables formation of grooves in a predetermined pattern with the flatness of the substrate surface being maintained as before the processing. Therefore, a plurality of protuberance electrodes uniform in height as compared with the protuberance electrodes obtained by the conventional plating method can be easily formed on one and same substrate. By laminating such a counter substrate with a plurality of such protuberance electrodes having a uniform height on the active matrix substrate with use of the anisotropic conductive adhesive, a two-dimensional image detector hardly prone to connection defects can be realized, even in the case where electric connection has to be obtained densely in a large surface area.

Incidentally, another method of forming a plurality of the protuberance electrodes with a uniform height on the basis of the identical principles is a method of forming the grooves on the substrate surface by etching. The etching, however, makes the manufacturing process more complicated since, in the case where a carrier blocking layer and a connecting electrode are present on the substrate surface, an etching liquid or an etching gas has to be changed so as to be suited to each film.

In formation of the grooves by sandblasting, on the other hand, since the grooves are physically formed by causing the ceramic particles to collide against the substrate surface, even in the case where the carrier blocking layer or the connecting electrode, for example, are present on the substrate surface, the grooves can be formed by boring these films through one step. Therefore, this method is superior from the viewpoints of simplification of manufacturing process and lowering of costs.

A second method for manufacturing a two-dimensional image detector of the present invention is a method for manufacturing a two-dimensional image detector which includes an active matrix substrate and a counter substrate, the active matrix substrate having a pixel-arrayed layer composed of electrode lines provided in a lattice form, a plurality of switching elements provided at respective lattice points, and charge storage capacitors having pixel electrodes connected to the electrode lines through the switching elements, the counter substrate having an electrode section formed so as to face substantially an entirety of a surface of the pixel-arrayed layer and a semiconductor layer with photoconductivity to be between the pixel-arrayed layer and the electrode section, the active matrix substrate and the counter substrate being electrically connected via a conductive material so that the pixel-arrayed layer of the active matrix substrate and the semiconductor layer of the counter substrate face each other, and the method includes the step of forming a plurality of pixels on a connection surface of the counter substrate by sandblasting.

The foregoing method, since pixels are formed by sandblasting, requires only a device which causes ceramic particles to collide against the substrate surface, and does not need an etching device. Moreover, in the case where a carrier blocking layer and a pixel electrode are present on the surface substrate, grooves can be formed by boring these films through one step. Therefore, this method is superior from the viewpoints of simplification of manufacturing process and lowering of costs.

A third method for manufacturing a two-dimensional image detector of the present invention is the first or second method further characterized in that the conductive material is an anisotropic conductive material having conductivity in only one direction.

By the foregoing method wherein the anisotropic conductive material is applied with respect to the substrate on which the protuberance electrodes are formed by sandblasting, a place accepting adhesive is ensured in a region where no protuberance electrode exist (that is, a region corresponding to a recessed portion). As a result, it is possible to manufacture a two-dimensional image detector which undergoes neither defect of connection between the active matrix substrate and the counter substrate, nor cross-talk across neighboring pixels.

A fourth method for manufacturing a two-dimensional image detector of the present invention is the first or second method further characterized in that the conductive material is patterned into units respectively corresponding to pixels.

Therefore, in the case where the conductivity of the conductive material is not anisotropic, no cross-talk occurs between neighboring pixels in the connection part.

A fifth method for manufacturing a two-dimensional image detector of the present invention is the first or second method further characterized in that a plurality of the protuberance electrodes or pixels are formed on the connection surface of the counter substrate through the step which includes the sub-steps of (i) forming a connecting electrode over substantially an entirety of a surface of the semiconductor layer of the counter substrate, (ii) forming on the connecting electrode a mask having an opening in a predetermined pattern, (iii) processing the mask-covered surface of the connecting electrode and semiconductor layer by blasting, so that at the opening of the mask the connecting electrode is removed while a groove is formed on the semiconductor layer, and (iv) removing the mask.

Therefore, in addition to an effect of easier formation of a plurality of protuberance electrodes uniform in height on one and same substrate, another effect as follows can be achieved: the patterning of the connecting electrode formed on the semiconductor layer surface and the formation of the protuberances (grooves in a lattice form) can be carried out through one and same step, thereby making the manufacturing method superior from the viewpoints of simplification of manufacturing process and lowering of costs. The same superiority from the viewpoints of simplification of manufacturing process and lowering of costs applies to the case of formation of pixels.

A sixth method for manufacturing a two-dimensional image detector of the present invention is the first or second method further characterized in that a plurality of the protuberance electrodes or pixels are formed on the connection surface of the counter substrate through the step which includes the sub-steps of (i) forming a carrier blocking layer over substantially an entirety of a surface of the semiconductor layer of the counter substrate, (ii) forming on the carrier blocking layer a mask having an opening in a predetermined pattern, (iii) processing the mask-covered surface of the carrier blocking layer and semiconductor layer by blasting, so that at the opening of the mask the carrier blocking layer is removed while a groove is formed on the semiconductor layer, and (iv) removing the mask.

Therefore, in addition to an effect of easier formation of a plurality of protuberance electrodes uniform in height on one and same substrate, another effect as follows can be achieved: the patterning of the carrier blocking layer formed on the semiconductor layer surface and the formation of the protuberances (grooves in a lattice form) can be carried out through one and same step, thereby making the manufacturing method superior from the viewpoints of simplification of manufacturing process and lowering of costs.

A seventh method for manufacturing a two-dimensional image detector of the present invention is the first or second method further characterized in that a plurality of the protuberance electrodes or pixels are formed on the connection surface of the counter substrate through the step which includes the sub-steps of (i) forming a carrier blocking layer and a connecting electrode over substantially an entirety of a surface of the semiconductor layer of the counter substrate, (ii) forming on the connecting electrode a mask having an opening in a predetermined pattern, (iii) processing the mask-covered surface of the connecting electrode and semiconductor layer by blasting, so that at the opening of the mask the connecting electrode and the carrier blocking layer are removed while a groove is formed on the semiconductor layer, and (iv) removing the mask.

Therefore, in addition to an effect of easier formation of a plurality of protuberance electrodes uniform in height on one and same substrate, another effect as follows is achieved: the patterning of the carrier blocking layer and the connecting electrode formed on the semiconductor layer surface and the formation of the protuberances (grooves in a lattice form) can be carried out through one and same step, thereby making the manufacturing method superior from the viewpoints of simplification of manufacturing process and lowering of costs. The same superiority from the viewpoints of simplification of manufacturing process and lowering of costs applies to the case of formation of pixels.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate being electrically connected to a connection surface of the counter substrate via a conductive material, said method including a step of forming a plurality of protuberance electrodes on the connection surface of the counter substrate, said step of forming the plurality of protuberance electrodes comprising the following substeps:
   a. forming a mask having openings in a predetermined pattern, on the electrode section;
   b. processing a mask-covered surface of the electrode section and semiconductor layer by blasting, so that at the openings of the mask the electrode section is removed while grooves are formed on the semiconductor layer; and
   c. removing the mask.

2. The two-dimensional image detector manufacturing method set forth in claim 1, wherein the blasting is sandblasting using grinding particles as blasting material.

3. The two-dimensional image detector manufacturing method set forth in claim 1, wherein the electrode section includes connecting electrodes formed over substantially an entirety of a surface of the semiconductor layer.

4. The two-dimensional image detector manufacturing method set forth in claim 1, wherein the electrode section includes a carrier blocking layer formed over substantially an entirety of a surface of the semiconductor layer.

5. The two-dimensional image detector manufacturing method set forth in claim 1, wherein the electrode section includes connecting electrodes and a carrier blocking layer formed over substantially an entirety of a surface of the semiconductor layer.

6. The two-dimensional image detector manufacturing method set forth in claim 4, wherein the carrier blocking layer is formed with a p-type impurity-doped or n-type impurity-doped semiconductor material having low resistance.

7. The two-dimensional image detector manufacturing method set forth in claim 2, wherein ceramic particles with a diameter of 5 $\mu$m to 20 $\mu$m are used as blasting materials.

8. The two-dimensional image detector manufacturing method set forth in claim 1, wherein each groove has a depth of 5 $\mu$m to 20 $\mu$m.

9. The two-dimensional image detector manufacturing method set forth in claim 1, wherein each groove has a width of 20 $\mu$m to 50 $\mu$m.

10. The two-dimensional image detector manufacturing method set forth in claim 1, wherein the conductive material is an anisotropic conductive material having conductivity in only one direction.

11. The two-dimensional image detector manufacturing method set forth in claim 1, wherein the conductive material is patterned into units respectively corresponding to pixels.

12. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate being electrically connected to a connection surface of the counter substrate via a conductive material, said method including a step of forming a plurality of protuberance electrodes on the connection surface of the counter substrate, said step of forming the plurality of protuberance electrodes comprising the following substeps:
  a. forming connecting electrodes over substantially an entirety of a surface of the semiconductor layer of the counter substrate;
  b. forming on the connecting electrodes a mask having openings in a predetermined pattern;
  c. processing, a mask-covered surface of the connecting electrodes and semiconductor layer by blasting, so that at the openings of the mask the connecting electrodes are removed while grooves are formed on the semiconductor layer; and
  d. removing the mask.

13. The two-dimensional image detector manufacturing method set forth in claim 12, wherein the conductive material is an anisotropic conductive material having conductivity in only one direction.

14. The two-dimensional image detector manufacturing method set forth in claim 12, wherein the conductive material is patterned into units respectively corresponding to pixels.

15. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate being electrically connected to a connection surface of the counter substrate via a conductive material, said method including a step of forming a plurality of protuberance electrodes on the connection surface of the counter substrate, said step of forming the plurality of protuberance electrodes comprising the following substeps:
  a. forming a carrier blocking layer over substantially an entirety of a surface of the semiconductor layer of the counter substrate;
  b. forming on the carrier blocking layer a mask having openings in a predetermined pattern;
  c. processing, a mask-covered surface of the carrier blocking layer and semiconductor layer by blasting, so that at the openings of the mask the carrier blocking layer is removed while grooves are formed on the semiconductor layer; and
  d. removing the mask.

16. The two-dimensional image detector manufacturing method set forth in claim 15, wherein the conductive material is an anisotropic conductive material having conductivity in only one direction.

17. The two-dimensional image detector manufacturing method set forth in claim 15, wherein the conductive material is patterned into units respectively corresponding to pixels.

18. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate being electrically connected to a connection surface of the counter substrate via a conductive material, said method including a step of forming a plurality of protuberance electrodes on the connection surface of the counter substrate, said step of forming the plurality of protuberance electrodes comprising the following substeps:
  a. forming a carrier blocking layer and connecting electrodes over substantially an entirety of a surface of the semiconductor layer of the counter substrate;
  b. forming on the connecting electrodes a mask having openings in a predetermined pattern;
  c. processing, a mask-covered surfaces of the connecting electrodes and semiconductor layer by blasting, so that at the openings of the mask the connecting electrodes and the carrier blocking layer are removed while grooves are formed on the semiconductor layer; and
  d. removing the mask.

19. The two-dimensional image detector manufacturing method set forth in claim 18, wherein the conductive material is an anisotropic conductive material having conductivity in only one direction.

20. The two-dimensional image detector manufacturing method set forth in claim 18, wherein the conductive material is patterned into units respectively corresponding to pixels.

21. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate and the counter substrate being electrically connected via a conductive material, said method comprising the step of forming a plurality of pixels elements on a connection surface of the counter substrate, each of said pixel elements together with said pixel-arrayed layer comprising a pixel, said step of forming the plurality of pixel elements comprising the following substeps:
  a. forming connecting electrodes over substantially an entirety of a surface of the semiconductor layer of the counter substrate;
  b. forming on the connecting electrodes a mask having openings in a predetermined pattern;
  c. processing a mask-covered surfaces of the connecting electrodes and semiconductor layer by blasting, so that at the openings of the masks the connecting electrodes are removed while grooves are formed on the semiconductor layer; and
  d. removing the mask.

22. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate and the counter substrate being electrically connected via a conductive material, said method comprising the step of forming a plurality of pixels elements on a connection surface of the counter substrate, each of said pixel elements together with said pixel-arrayed layer comprising a pixel, said step of forming the plurality of pixel elements comprising the following substeps:

a. forming a carrier blocking layer over substantially an entirety of a surface of the semiconductor layer of the counter substrate;

b. forming on the carrier blocking layer a mask having openings in a predetermined pattern;

c. processing, a mask-covered surface of the carrier blocking layer and semiconductor layer by blasting, so that at the openings of the mask the carrier blocking layer is removed while grooves are formed on the semiconductor layer; and d. removing the mask.

23. A method for manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate and the counter substrate being electrically connected via a conductive material, said method comprising the step of forming a plurality of pixels elements on a connection surface of the counter substrate, each of said pixel elements together with said pixel-arrayed layer comprising a pixel, said step of forming the plurality of pixel elements comprising the following substeps:

a. forming a carrier blocking layer and connecting electrodes over substantially an entirety of a surface of the semiconductor layer of the counter substrate;

b. forming on the connecting electrodes a mask having openings in a predetermined pattern;

c. processing a mask-covered surfaces of the connecting electrodes and semiconductor layer by blasting, so that at the openings of the masks the connecting electrodes and the carrier blocking layer are removed while grooves are formed on the semiconductor layer; and d. removing the mask.

24. For use in manufacturing a two-dimensional image detector, the two-dimensional image detector including an active matrix substrate and a counter substrate, the active matrix substrate having a pixel-arrayed layer in which pixel electrodes and switching elements are arrayed in a lattice form, the counter substrate having a semiconductor layer with photoconductivity and an electrode section formed so as to face substantially an entirety of a surface of the pixel-arrayed layer, the active matrix substrate being electrically connected to a connection surface of the counter substrate via a conductive material, a method comprising blasting selected portions of the connection surface of the counter substrate to form a plurality of protuberance electrodes and grooves in the semiconductor layer;

controlling a depth of the grooves in dependence upon a thickness of the conductive material and a diameter of conductive particles in the conductive material.

25. The method of claim 24, wherein the conductive material is an anisotropic conductive material.

26. The method of claim 24, wherein the depth of the grooves is preferably between 5 $\mu$m and 20 $\mu$m.

* * * * *